United States Patent [19]
Lee

[11] Patent Number: 5,672,985
[45] Date of Patent: Sep. 30, 1997

[54] PROGRAMMABLE LOGIC ARRAY INTEGRATED CIRCUITS WITH CARRY AND/OR CASCADE RINGS

[75] Inventor: Fung Fung Lee, Milpitas, Calif.

[73] Assignee: Altera Corporation, San Jose, Calif.

[21] Appl. No.: 574,351

[22] Filed: Dec. 18, 1995

[51] Int. Cl.$^6$ .................................................. H03K 19/177
[52] U.S. Cl. ................................ 326/41; 326/39; 326/47
[58] Field of Search .............................. 326/37–41, 17, 326/101

[56] References Cited

U.S. PATENT DOCUMENTS

| Re. 34,363 | 8/1993 | Freeman . | |
|---|---|---|---|
| 3,473,160 | 10/1969 | Wahlstrom | 340/172.5 |
| 4,609,986 | 9/1986 | Hartmann et al. | 364/200 |
| 4,617,479 | 10/1986 | Hartmann et al. . | |
| 4,642,487 | 2/1987 | Carter . | |
| 4,677,318 | 6/1987 | Veenstra . | |
| 4,713,792 | 12/1987 | Hartmann et al. | 364/900 |
| 4,758,745 | 7/1988 | Elgamal et al. . | |
| 4,774,421 | 9/1988 | Hartmann et al. . | |
| 4,871,930 | 10/1989 | Wong et al. . | |
| 4,899,067 | 2/1990 | So et al. . | |
| 4,912,342 | 3/1990 | Wong et al. . | |
| 5,121,006 | 6/1992 | Pedersen . | |
| 5,220,214 | 6/1993 | Pedersen . | |
| 5,258,668 | 11/1993 | Cliff et al. . | |
| 5,260,610 | 11/1993 | Pedersen et al. . | |
| 5,260,611 | 11/1993 | Cliff et al. . | |
| 5,274,581 | 12/1993 | Cliff et al. | 364/784 |
| 5,349,250 | 9/1994 | New | 326/44 |
| 5,350,954 | 9/1994 | Patel . | |
| 5,362,999 | 11/1994 | Chiang | 326/17 |
| 5,371,422 | 12/1994 | Patel et al. | 326/41 |
| 5,481,486 | 1/1996 | Cliff et al. | 364/716 |
| 5,537,057 | 7/1996 | Leong et al. | 326/39 |

OTHER PUBLICATIONS

R. C. Minnick, "A Survey of Microcellular Research," Journal of the Association for Computing Machinery, vol. 14, No. 2, pp. 203–241, Apr. 1967.

S. E. Wahlstrom, "Programmable Logic Arrays—Cheaper by the Millions," Electronics, Dec. 11, 1967, pp. 90–95.

*Recent Developments in Switching Theory*, A. Mukhopadhyay, ed., Academic Press, New York, 1971, chapters VI and IX, pp. 229–254 and 369–422.

El Gamal et al., "An Architecture for Electrically Configurable Gate Arrays," IEEE Journal of Solid–State Circuits, vol. 24, No. 2, Apr. 1989, pp. 394–398.

El–Ayat et al., "A CMOS Electrically Configurable Gate Array," IEEE Journal of Solid–State Circuits, vol. 24, No. 3, Jun. 1989, pp. 752–762.

"XC5000 Logic Cell Array Family, Technical Data, Advance Information," Xilinx, Inc., Feb. 1995.

*Primary Examiner*—Edward P. Westin
*Assistant Examiner*—Jon Santamauro
*Attorney, Agent, or Firm*—Fish & Neave; Robert R. Jackson

[57] ABSTRACT

Logic regions in a programmable logic array integrated circuit are interconnected in a closed loop or ring by carry and/or cascade connections. Because such a loop or ring has no ends, a user's logic that uses carry or cascade connections can be placed anywhere along the ring. This eliminates a prior art constraint on the placement of a user's logic on the integrated circuit.

3 Claims, 6 Drawing Sheets

PROGRAMMABLE LOGIC ARRAY INTEGRATED CIRCUITS WITH CARRY AND/OR CASCADE RINGS

BACKGROUND OF THE INVENTION

This invention relates to programmable logic array integrated circuits, and more particularly to interconnections between the logic regions in such circuits for such purposes as performing arithmetic carry or logic cascade functions.

A typical programmable logic array integrated circuit device includes a plurality of programmable logic regions, which may be disposed on the device in a two-dimensional array of intersecting rows and columns of such regions (see, for example, commonly assigned, co-pending Cliff et al. U.S. patent application Ser. No. 08/442,795, filed May 17, 1995, which is hereby incorporated by reference herein). The logic regions may be either individual logic modules (e.g., logic modules 30 in the above-mentioned Cliff et al. specification) or groups of logic modules (e.g., logic regions 20 in the above-mentioned Cliff et al. specification). Each logic region is programmable to perform one or more relatively elementary logic functions. For example, if a logic region is a logic module 30 of the type shown in the Cliff et al. specification, each logic region may be programmable to produce an output signal which is any logical combination of four inputs. In addition, the logic region may be programmable to provide this output signal in either registered or unregistered form. Another programmable capability of the logic region may be to perform one place of binary addition and produce both a sum out signal and a carry out signal. The carry out signal of each logic region is applied substantially directly to an adjacent logic region for use as a carry in signal in the binary addition performed by the adjacent logic region. Still another programmable capability of the logic region may be to accept (substantially directly) the main output of an adjacent logic region and logically combine that signal with a signal generated in the logic region to produce the main output of the logic region. In this way the logic performed by adjacent logic regions can be cascaded (e.g., to facilitate performing logic functions with large fan in).

In addition to the substantially direct connections between adjacent logic regions described in the preceding paragraph (i.e., for arithmetic carry and/or for logic cascading), a programmable logic array integrated circuit also typically includes a programmable network of more general-purpose interconnection conductors. This more general interconnection conductor network is programmable to connect the output(s) of each logic region to substantially any logic region input on the device. In addition, this more general interconnection conductor network may be used to bring logic signals into the device and to convey other logic signals out of the device.

The above-mentioned carry and/or cascade connections are a useful supplement to the general-purpose interconnection conductor network because the carry and/or cascade connections tend to be faster and to reduce consumption of the more expensive general interconnection resources. (The general interconnections are characterized as "more expensive" because they tend to require more space and related resources such as programmable switches.)

As shown in the above-mentioned Cliff et al. specification, carry and/or cascade connection chains preferably extend not only between adjacent logic modules, but also between groups of logic modules (called logic regions 20 in the Cliff et al. specification). Thus the references to logic regions herein in relation to carry and/or cascade connections can be to either individual logic modules or to groups of logic modules.

Carry connections are also the subject of Cliff et al. U.S. Pat. No. 5,274,581, Cliff et al. U.S. Pat. No. 5,481,486, and Lee et al. U.S. patent application Ser. No. 08/522,554, filed Sep. 1, 1995. Cascade connections are also the subject of Cliff et al. U.S. Pat. No. 5,258,668. All of these other documents are hereby incorporated by reference herein.

A possible shortcoming of the previously known arrangements for carry and/or cascade connections is that the chains of such connections have definite starting and ending points. This can act as a constraint on the placement of a user's logic design in the programmable logic device. For example, a binary addition requiring several arithmetic places cannot conveniently be placed so close to either end of a conventional carry chain that some of the arithmetic places are beyond the end of the chain. Such a constraint may limit the usability of the device for implementing certain user logic designs.

In view of the foregoing, it is an object of this invention to improve carry and/or cascade connections in programmable logic array integrated circuits.

It is a more particular object of this invention to provide programmable logic array integrated circuits with carry and/or cascade connections that do not have starting and ending points that can limit the usability of those connections.

SUMMARY OF THE INVENTION

These and other objects of the invention are accomplished in accordance with the principles of the invention by providing programmable logic array integrated circuits with one or more chains of carry and/or cascade connections in the form of closed, endless loops or rings. In this way logic requiring a carry or cascade chain can be placed anywhere along the ring. There are no physical endpoints to constrain placement of carry or cascade logic on the device.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
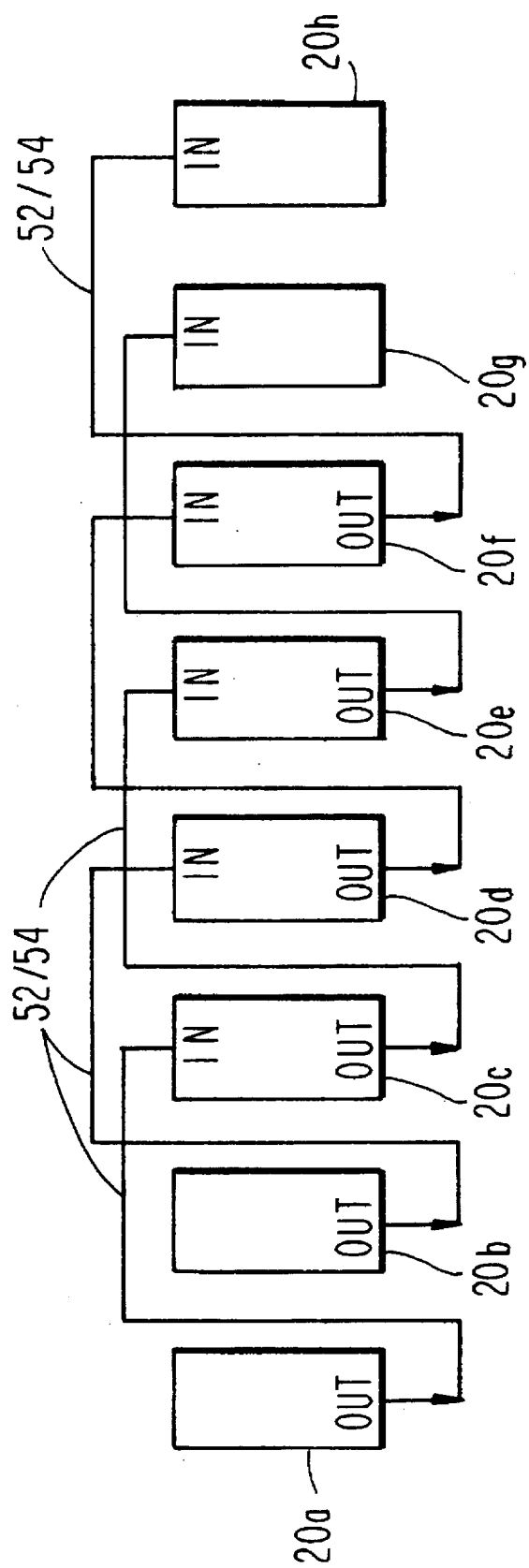
FIG. 1 is a simplified block diagram of illustrative prior art carry and/or cascade connection chains.

A typical prior art carry or cascade chain is shown in FIG. 1. This FIG. is a somewhat simplified version of what is shown in FIG. 11 of Cliff et al. application Ser. No. 08/442, 795. For example FIG. 1 assumes that there are only eight logic regions 20a through 20h in a half row of such regions.

There are two separate, interdigitated chains of cascade and/or carry connections 52/54 shown in FIG. 1. (As in FIG. 11 of the immediately above-mentioned Cliff et al. specification, each line 52/54 can be a carry connection, a cascade connection, or both types of the connections in parallel. Accordingly, the generic term "carry/cascade connection" or the like will be used herein to refer to any of these three possibilities.) The first of the carry/cascade chains shown in FIG. 1 starts in logic region 20a, continues successively through logic regions 20c and 20e, and ends in logic region 20g. The second carry/cascade chain starts in logic region 20b, continues successively through logic regions 20d and 20f, and ends in logic region 20h. Together, these two chains have four endpoints (i.e., two beginnings (in logic regions 20a and 20b) and two endings (in logic regions 20g and 20h)). As discussed in the Background section of this specification, these endpoints constitute potentially undesirable constraints on placement of portions of a user's logic design that need the benefit of carry/cascade connections.

Figure 2:
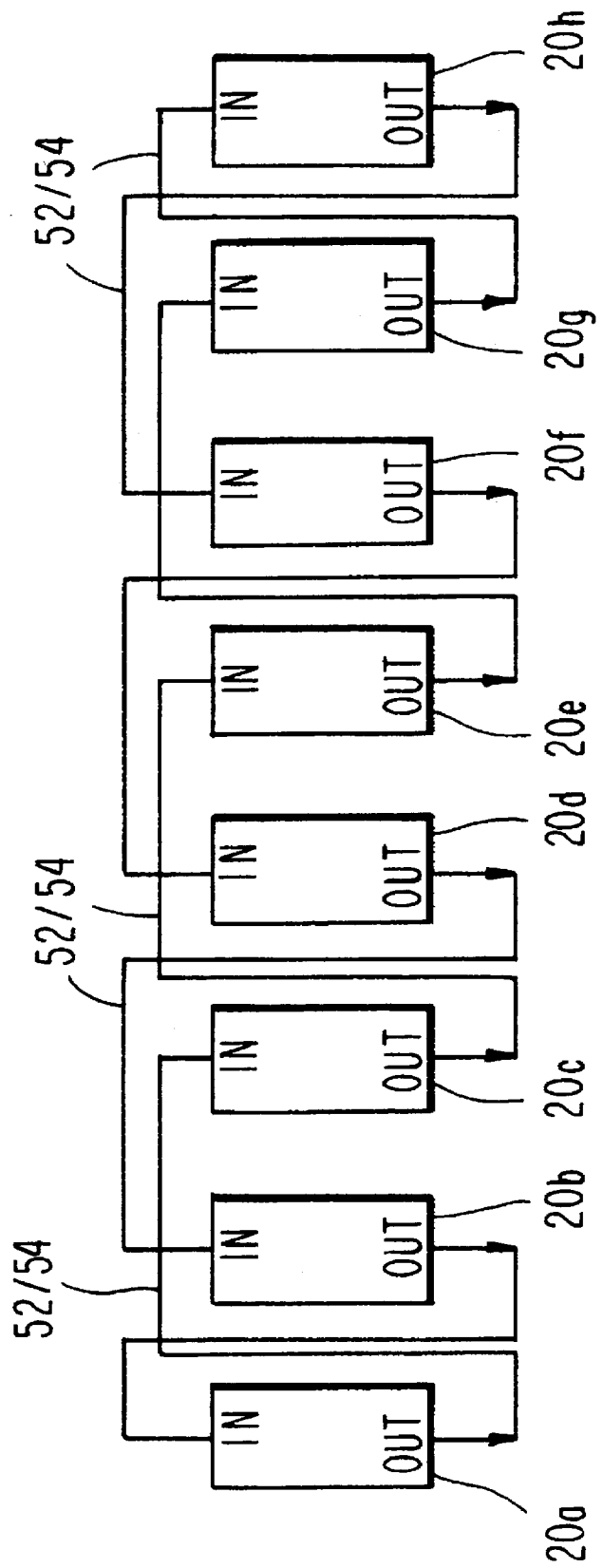
FIG. 2 shows an illustrative embodiment of modification of the apparatus of FIG. 1 in accordance with this invention.

FIG. 2 shows an illustrative modification of the apparatus of FIG. 1 in accordance with this invention. In this modification all eight logic regions 20a through 20h are connected in one endless carry/cascade ring. Starting (arbitrarily) with logic region 20a, this ring of carry/cascade connections 52/54 runs successively through logic regions 20c, 20e, 20g, 20h, 20f, 20d, 20b, and back to 20a. Because this ring has no endpoints, logic employing carry/cascade connections can be placed anywhere along the ring. This eliminates all constraints (due to carry/cascade chain endpoints) on the placement of logic on the device.

Figure 3:
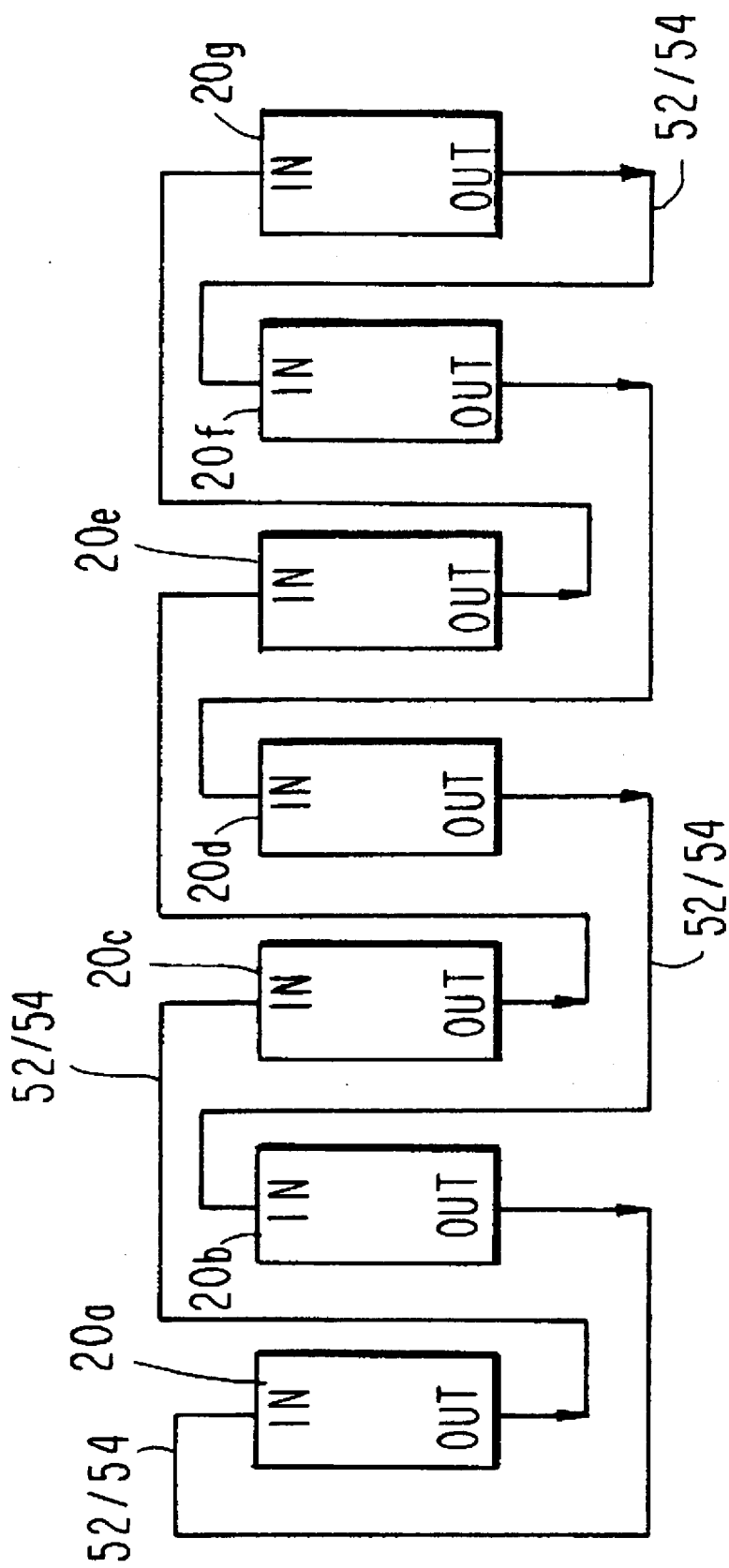
FIG. 3 is another view similar to FIGS. 1 and 2, showing another illustrative embodiment of the invention.

In using an arrangement of the type shown in FIG. 2 for an even number n of logic regions 20 (and converting from letters a, b, c, etc., to numbers 1, 2, 3, etc., to identify successive logic regions), the order of the logic regions in the ring will be 1, 3, 5, . . . , n-1, n, n-2, . . . , 4, 2, 1. If n is odd, then the order of the logic regions in the ring will be 1, 3, 5, . . . n-2, n, n-1, . . . , 4, 2, 1. FIG. 3 shows an example of the foregoing for n=7.

Although FIGS. 2 and 3 have different numbers of logic regions in the depicted carry/cascade rings, these rings have certain properties in common. For example, both of these rings are made up of two interdigitated subseries of logic regions which are mutually exclusive but collectively exhaustive of the logic regions. In one of these subseries, the carry/cascade connections connect the logic regions in series order. In the other subseries the carry/cascade connections connect the logic regions in reverse series order. Adjacent ends of the subseries are connected to one another by other carry/cascade connections. Arrangements of this general type are presently preferred because they tend to make all of the carry/cascade connections generally similar in length, thereby keeping carry/cascade signal transmission delays relatively uniform everywhere along the carry/cascade ring or loop.

Figure 4:
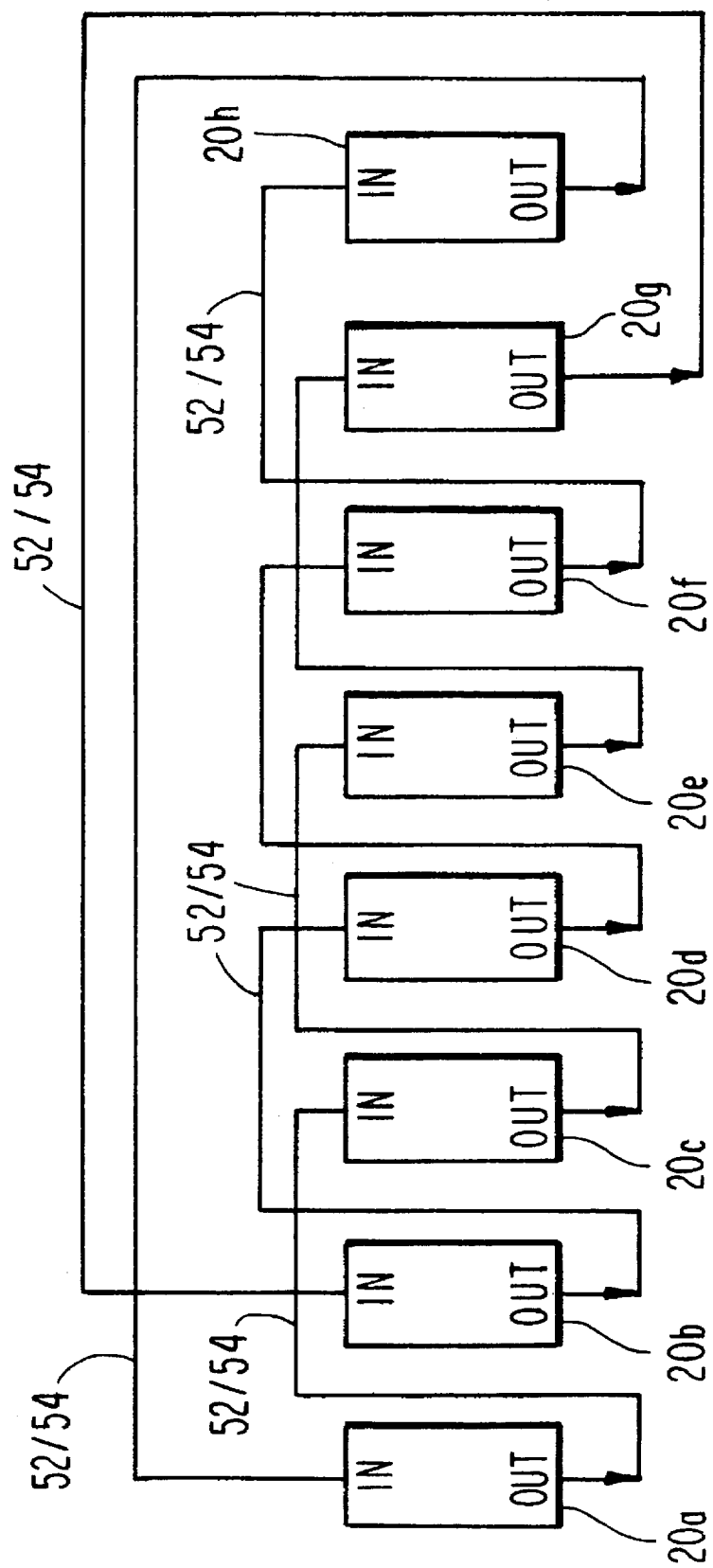
FIG. 4 is again similar to FIGS. 1–3, showing yet another illustrative embodiment of the invention.

Although arrangements of the general type shown in FIGS. 2 and 3 are thus particularly preferred, many other arrangements of connections 52/54 are possible to produce endless carry/cascade connection rings in accordance with this invention. For example, FIG. 4 shows another possible modification of the FIG. 1 apparatus in which the carry/cascade output 52/54 from logic region 20g is connected back to logic region 20b, and the carry/cascade output 52/54 from logic region 20h is connected back to logic region 20a to again connect all of logic regions 20a through 20h in one endless ring whose sequence is 20a, 20c, 20e, 20g, 20b, 20d, 20f, 20h, 20a. Another arrangement of this general type would connect the logic regions in the sequence 20a, 20b, 20c, 20d, 20e, 20f, 20g, 20h, 20a. These kinds of arrangements, however, may have some carry/cascade connections 52/54 that are much longer than others. In FIG. 4, for example, the connections from region 20g to region 20b and from region 20h to region 20a are significantly longer than the other connections 52/54. This may produce undesirably long signal transmission delays at certain points in the carry/cascade ring.

The most recently above-mentioned Cliff et al. specification explains that it is desirable to provide at least one spare logic region 20s so that if there is a defect in a regular logic region (e.g., any one of the regions 20 depicted thus far), the logic functions that would normally be performed by the defective regular logic region can be shifted away from that region and the spare region put to use to make up for the loss of the defective region. FIG. 5 is again similar to FIG. 11 in the immediately above-mentioned Cliff et al. specification, but explicitly shows spare logic region 20s. As in the Cliff et al. specification, if one of regular logic regions 20a through 20h is defective, its normal logic functions are shifted to the next lower lettered logic region, the normal functions of that logic region are shifted to the next still lower lettered logic region, and so on until spare logic region 20s is put to use. For example, if logic region 20c is defective, its normal functions are shifted to logic region 20b, the normal functions of region 20b are shifted to region 20a, and the normal functions of region 20a are shifted to region 20s. Regions 20d through 20h continue to perform their normal functions.

Figure 5:
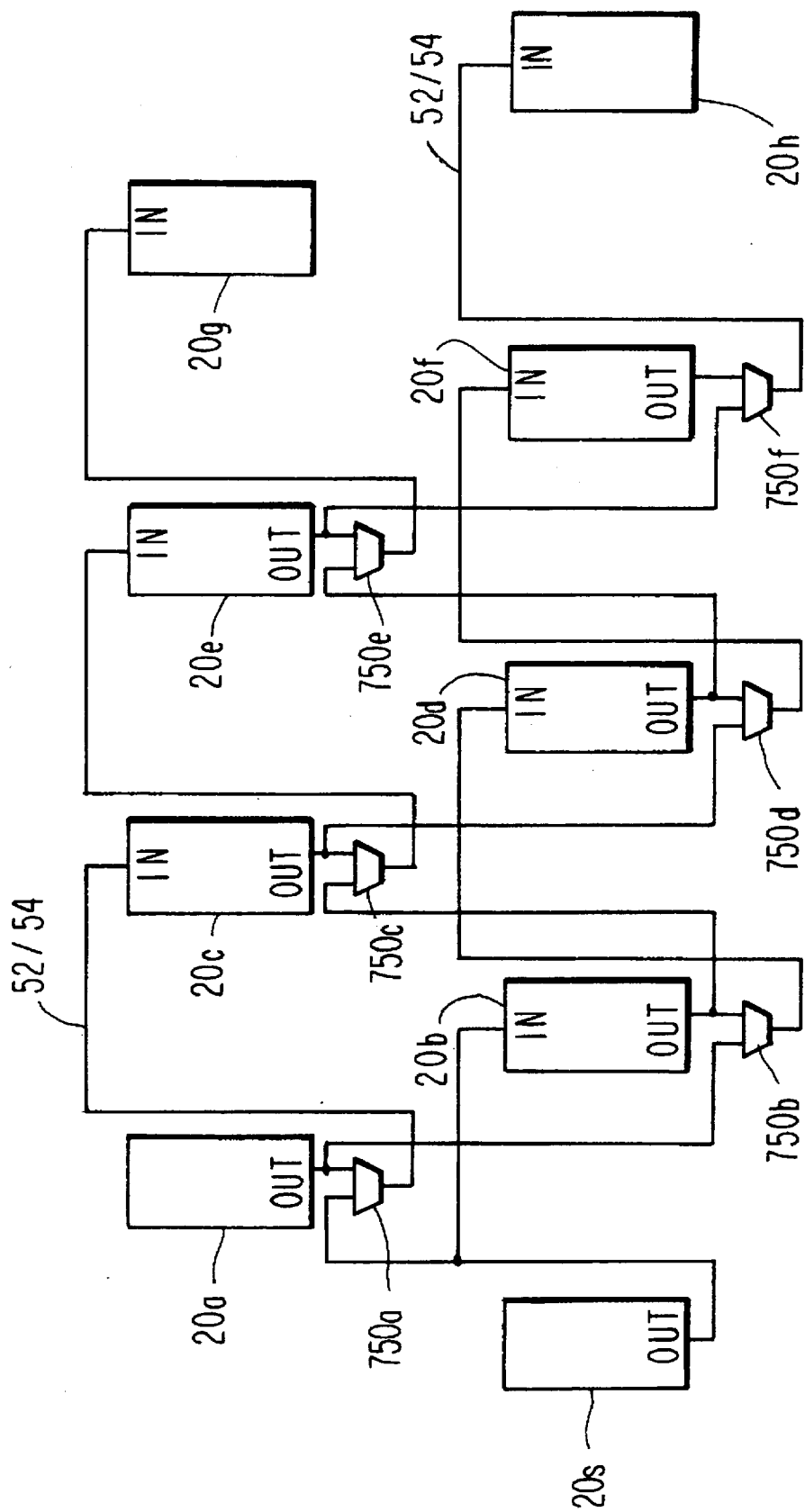
FIG. 5 shows prior art enhancement of the apparatus of FIG. 1 to make possible the use of a spare logic region in the event that a regular logic region is defective.

Switches 750 in FIG. 5 allow the carry/cascade chain 52/54 to operate despite such possible shifting of logic functions due to a defective logic region. The normal condition of each switch 750 is to connect its right-hand input (i.e., the carry/cascade output from the associated logic region) to its output. If all of switches 750 are in this condition, spare logic region 20s is not being used and the carry/cascade chains in FIG. 5 are the same as are shown in FIG. 1. On the other hand, if there is a defective regular logic region, the switch 750 associated with that logic region is controlled to connect its left-hand input (i.e., the carry/cascade output from the next lower lettered logic region) to the output of that switch 750. The switches 750 associated with some or all of the logic regions to the left of the defective region may also have to be switched. For example, if logic region 20c is defective, switches 750b and 750c are both controlled to apply their left-hand inputs to their outputs. (In this case the state of switch 750a is a "don't care" because its output is not being used.) This allows logic region 20b to take the place of logic region 20c in the carry/cascade chain that normally includes logic region 20c (just as region 20b replaces region 20c for all other purposes). Operation of switch 750b as described above allows region 20a to take the place of region 20b in the carry/cascade chain that normally includes region 20b (just as region 20a replaces region 20b for all other purposes). And region 20s takes the place of region 20a in the carry/cascade chain that normally includes region 20a (just as region 20s replaces region 20a for all other purposes).

Figure 6:
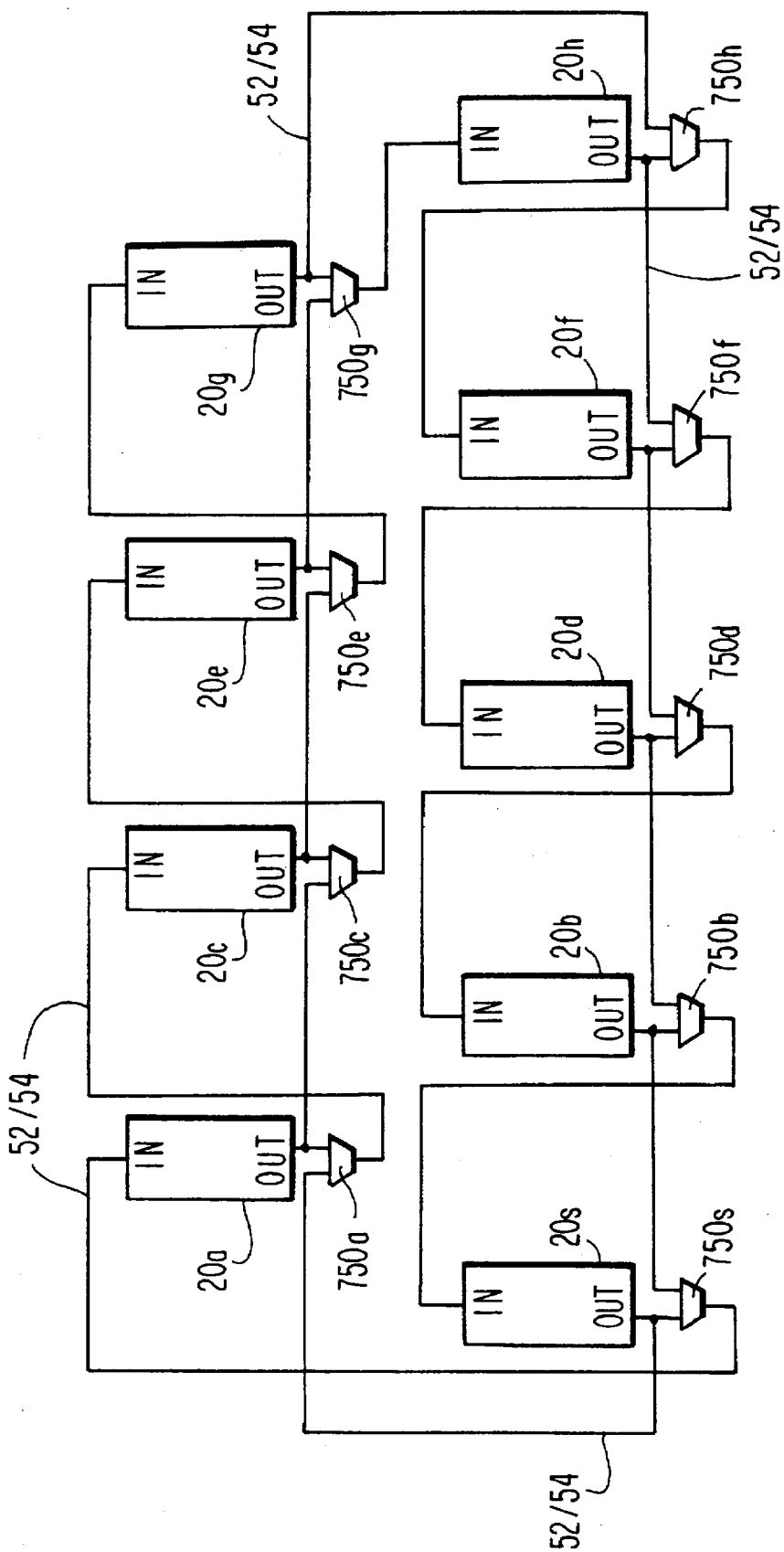
FIG. 6 shows an illustrative embodiment of modification of apparatus of the general type shown in FIG. 5 in accordance with this invention.

FIG. 6 shows modification of the apparatus of FIG. 2 in accordance with this invention to allow logic function shifting in the event of a defective regular logic region without breaking an endless carry/cascade ring of this invention. In this example, however, if any one of logic regions 20a, 20c, 20e, or 20g is defective, the functions of that region are shifted to the left among those regions and the functions of logic region 20a are shifted to spare logic region 20s. On the other hand, if any one of logic regions 20b, 20d, 20f, and 20h are defective, the functions of that region are shifted to the left among those regions and the functions of logic region 20b are shifted to spare logic region 20s. Thus the shifting of functions in FIG. 6 is slightly different than the shifting of functions in FIG. 5.

In FIG. 6 the normal condition of each switch 750a–h is to apply the carry/cascade output 52/54 of the associated regular logic region 20a–h, respectively, to the output of that switch. The normal condition of switch 750s, on the other hand, is to apply the carry/cascade output 52/54 of spare logic region 20b to the output of switch 750s. This cuts spare logic region 20s out of the carry/cascade loop, thereby making that loop the same as is shown in FIG. 2.

If a regular logic region in the group 20a, 20c, 20e, and 20g is defective, however, the switch 750 associated with that logic region is switched to pass the carry/cascade output from the next lower lettered logic region in that group. Switch 750s is also switched to pass the carry/cascade output of spare logic region 20s. On the other hand, if a regular logic region in group 20b, 20d, 20f, and 20h is defective, the switch 750 associated with that logic region is switched to pass the carry/cascade output of the next higher lettered logic region in that group. Switch 750s is also switched to pass the carry/cascade output of logic region 20s. In this way the carry/cascade signals are shifted in the same way that all other logic region functions are shifted to make up for any defective regular logic region. The endless carry/cascade connection ring of this invention remains intact despite such logic function shifting.

It will be understood that the foregoing is only illustrative of the principles of this invention, and that various modifications can be made by those skilled in the art without departing from the scope and spirit of the invention. For example, the numbers of logic regions in the rings shown in the drawings are only illustrative, and any number of logic regions can be included in such rings.

The invention claimed is:

1. A programmable logic array integrated circuit comprising:

a plurality of regions of programmable logic, each of which has an input for a carry/cascade signal and an output for a carry/cascade signal, said logic regions being disposed on said integrated circuit in an ordered series in which successive logic regions in said series are physically adjacent to one another; and a plurality of carry/cascade signal paths, each of which is usable substantially only for conveying a carry/cascade signal, each of said carry/cascade signal paths extending from a respective one of said outputs to a respective one of said inputs, the input and output associated with each of said carry/cascade signal paths being the input and output of different ones of said logic regions so that said carry/cascade signal paths collectively interconnect said logic regions in a closed loop, said series being further divided into two interdigitated subseries which are mutually exclusive and collectively exhaustive, wherein carry/cascade signal paths interconnect successive logic regions in a first of said subseries in series order, wherein carry/cascade signal paths interconnect successive logic regions in a second of said subseries in reverse series order, and wherein at each end of said subseries a carry/cascade signal path interconnects said subseries by interconnecting adjacent logic regions at said end of said subseries.

2. The apparatus defined in claim 1 wherein each of said carry/cascade signal paths includes a switch for selectively substituting the signal on another of said carry/cascade signal paths for the signal that said carry/cascade signal path would otherwise apply to the associated input.

3. The apparatus defined in claim 2 wherein each of said carry/cascade signal paths is said another of said carry/cascade signal paths for a respective one of said carry/cascade signal paths.

* * * * *